United States Patent [19]

Nohava et al.

[11] Patent Number: 4,490,441

[45] Date of Patent: Dec. 25, 1984

[54] ENCAPSULATED CDTE BOULES FOR MULTIBLADE WAFERING

[75] Inventors: Thomas E. Nohava, Inver Grove Heights; Joseph L. Schmit, Hopkins, both of Minn.

[73] Assignee: Honeywell Inc., Minneapolis, Minn.

[21] Appl. No.: 395,521

[22] Filed: Jul. 6, 1982

[51] Int. Cl.$^3$ ............................................. B32B 15/00
[52] U.S. Cl. ................................ 428/697; 428/542.8; 428/699
[58] Field of Search ...................... 428/403, 542.8, 699, 428/689, 697, 585, 577

[56] References Cited

U.S. PATENT DOCUMENTS 2,858,730 11/1958 Hanson .
3,032,026 5/1962 Raabe .
4,227,348 10/1980 Demers .
4,274,389 6/1981 White et al. .

*Primary Examiner*—Lorraine T. Kendell
*Attorney, Agent, or Firm*—Omund R. Dahle

[57] ABSTRACT

A cadmium telluride boule encapsulated with an encapsulant material consisting of about 80% by volume of powdered beta-phase calcium sulfate hemihydrate, about 20% by volume of powdered alpha-phase calcium sulfate hemihydrate and water. This specially encapsulated boule can then be sawn with a multiblade wafering apparatus used to simultaneously saw the boule into multiple substrate wafers.

2 Claims, No Drawings

ENCAPSULATED CDTE BOULES FOR MULTIBLADE WAFERING

The Government has rights in this invention pursuant to a contract awarded by the Department of the Army.

BACKGROUND AND SUMMARY OF THE INVENTION

The present invention is directed to a preferred composition of an inorganic casting material for encapsulating and supporting cadmium telluride (CdTe) ingots or boules prior to and during wafering. CdTe is fragile and must be supported in a potting material during multiblade cutting or wafering. CdTe boules are usually not seeded when grown and thus their crystal orientation is random from one ingot to the next. Particularly since the (111) plane is of interest in the sawn wafers, the random orientation of the (111) plane in the CdTe ingot requires sawing into the ingot at odd angles which necessitates potting the boule to perform multiblade wafering. The hardness of the potting material (or encapsulant) must be of a comparable hardness to that of the CdTe boule.

DESCRIPTION

CdTe substrates are used in the liquid phase epitaxial growth of HgCdTe. Multiblade wafering is a preferred method being used to prepare the CdTe substrate wafers from the ingot or boule. Such a multiblade saw is preferably a large number of parallel blades spaced equally apart and connected such that they can be operated together in a reciprocating motion. Multiblade wafering was originally used for wafering silicon where the crystal orientation of interest was grown perpendicular to the boule length. The multiple sawblades thus moved equally into a silicon boule and the loading on each blade was nearly the same. In the presently grown CdTe boules, crystal orientation is not done during growth and thus the orientation is different in each ingot. Since the substrates wafered from the boule must be of a (111) orientation, the boule is usually not sawn perpendicular to its length. Thus in an angular cut into the ingot with a multiblade saw, blades on one end enter the boule before the blades on the opposite end. If the multiblade system is to be used with no damage or breakage of blades or of the CdTe being sliced all blades must have equal pressure applied. Also the CdTe crystal is fragile and must be supported during cutting. An encapsulant can be used to enclose and support the CdTe at the correct angle while providing a perpendicular face for the multiple blades to move into and thus assure that the maximum number of usable CdTe wafers will result. The choice of an encapsulant material mixture is critical to provide an encapsulant having about the same cutting rate as the crystal. If the encapsulant is too soft the blades wear only on the CdTe and notches develop. These notches then break the wafers as the cut proceeds into a larger part of the boule. On the other hand, if the encapsulant is too hard, cutting time becomes excessive and blades wear excessively before a cut is finished.

Applicants have previously tried a number of encapsulant material mixtures with only limited or moderate success. In the preferred embodiment listed below, however, greatly improved results have been obtained thus permitting successful multiblade wafering of CdTe boules. The preferred encapsulant for CdTe boules is an inorganic casting mixture consisting of about 80% by volume beta-phase calcium sulfate hemi hydrate ($\beta$—$CaSO_4 \cdot \frac{1}{2}H_2O$) and about 20% plaster of paris ($\alpha$—$CaSO_4 \cdot \frac{1}{2}H_2O$), however, the range of 85-15 to 75-25 may be used with tolerable mismatch of cutting rate. The beta-phase calcium sulfate hemi hydrate can be purchased commercially under the Tradename "Coecal Buff" dental cement. The plaster of paris provides a softening of the slightly hard Coecal Buff dental stone. Using this mixture and water to prepare and provide the encapsulant around the CdTe boule, applicants find no change in the cutting rate when the blades contact the CdTe buried in the encapsulant, and the blades wear evenly along their entire length, not just on the CdTe. The preferred mixture is easy to cast and requires a minimum of curing time. The encapsulant has been described for use with CdTe but is also usable for potting other materials to be cut, such as mercury cadmium telluride.

The embodiments of the invention in which an exclusive property or right is claimed are defined as follows:

1. A cadmium telluride boule encapsulated with an encapsulant material comprising about 80% by volume of powdered beta-phase calcium sulfate hemihydrate, about 20% by volume of powdered alpha-phase calcium sulfate hemihydrate and water.

2. A cadmium telluride boule according to claim 1 in which said encapsulant material has about the same cutting rate as said cadmium telluride boule it encapsulates to present a relative constant load to multiblade wafering apparatus used to simultaneously saw said boule into multiple substrate wafers.

* * * * *